United States Patent
Jennings

(10) Patent No.: US 12,368,416 B2
(45) Date of Patent: Jul. 22, 2025

(54) AUDIO AMPLIFIER WITH SWITCHABLE ACTIVE COMPONENTS

(71) Applicant: Christian Jennings, Toledo, OH (US)

(72) Inventor: Christian Jennings, Toledo, OH (US)

( * ) Notice: Subject to any disclaimer, the term of this patent is extended or adjusted under 35 U.S.C. 154(b) by 0 days.

(21) Appl. No.: 17/583,855

(22) Filed: Jan. 25, 2022

(65) Prior Publication Data
US 2022/0239263 A1    Jul. 28, 2022

Related U.S. Application Data

(60) Provisional application No. 63/141,653, filed on Jan. 26, 2021.

(51) Int. Cl.
*H03F 3/183*    (2006.01)

(52) U.S. Cl.
CPC ......... *H03F 3/183* (2013.01); *H03F 2200/03* (2013.01)

(58) Field of Classification Search
CPC ........ H03F 3/183; H03F 2200/03; H03F 1/33; H03F 5/00; H03F 3/181; G10H 2210/311; G10H 2230/015

USPC .......................................................... 381/120
See application file for complete search history.

(56) References Cited

U.S. PATENT DOCUMENTS

| | | | |
|---|---|---|---|
| 2011/0311076 A1* | 12/2011 | De Virgiliis | H03F 3/28 381/120 |
| 2012/0218043 A1* | 8/2012 | Teng | H03G 3/34 330/293 |
| 2013/0027131 A1* | 1/2013 | Lee | H03F 3/181 330/127 |

* cited by examiner

*Primary Examiner* — Carolyn R Edwards
*Assistant Examiner* — Friedrich Fahnert
(74) *Attorney, Agent, or Firm* — MacMillan, Sobanski & Todd, LLC

(57) ABSTRACT

An audio device for amplifying an audio signal enables a user to instantly switch between two or more active amplifying components, thereby allowing the user to evaluate the effect of a particular active amplifying component in the audio device. In one example, the audio device is an audio vacuum tube preamplifier, and has a circuit configuration that facilitates A/B comparison between two or more preamp tubes by hot switching between preamp tubes in the audio signal path. The input to the two or more tubes is switched between each tube by the listener on demand without pause or interruption to the music or program.

10 Claims, 2 Drawing Sheets

AUDIO AMPLIFIER WITH SWITCHABLE ACTIVE COMPONENTS

CROSS-REFERENCE TO RELATED APPLICATIONS

This application claims the benefit of U.S. Provisional Application No. 63/141,653, filed Jan. 26, 2021, the disclosure of which is incorporated herein by reference.

BACKGROUND OF THE INVENTION

This invention relates to an audio device and, in particular, to an audio amplifier with a configuration which allows the user to readily evaluate and compare selected similar active components of the amplifier.

In the days when the world ran on vacuum tubes the average consumer purchased an amp or receiver, plugged it in, and listened to it until one of the tubes went bad. Then they called the repairman or if they were handy and replaced the bad tube and got on with listening. Maybe they commented on how much better the device sounded with the new tube never imagining that the same tubes from different manufacturers all sounded different. Sometimes subtly and sometimes strikingly.

Ultimately solid state technology eclipsed vacuum tube based products but a small set of dedicated audiophiles never abandoned tube equipment. These folks knew there were good tubes and bad tubes, but were more likely to buy equipment that had the tubes they desired and replace one tube or another with like kind rather than replacing a pair, or replace the pair with like kind and keep the one good tube in a drawer as backup.

As the popularity of tube audio has surged in recent years, the availability of highly desirable vintage audio tubes is and continues to be a scavenger hunt for that backup tube sitting in a cigar box in someone's grandfather's basement. That highly desirable tube that can deliver a new experience with an old song.

This has led to a practice among audiophiles called "tube rolling". Tube rolling is the practice of changing out tubes to compare or exploit in some way the sonic qualities of one tube over another. This is a fairly recent practice and requires the listener to listen to one tube for a while, turn off the amplifier, wait for the tubes to cool somewhat, remove the installed tube, locate and install the comparison tube, turn on the amplifier, wait for it to warm up, restart the music, and then sit and try to determine if there is a difference between the two and determine what specifically is different.

SUMMARY OF THE INVENTION

This invention concerns an audio device for amplifying an audio signal that enables a user to instantly switch between two or more active amplifying components, thereby allowing the user to evaluate the effect of a particular active amplifying component in the audio device. In one example, the audio device is an audio vacuum tube preamplifier, and has a circuit configuration that facilitates AB comparison between two or more preamp tubes by hot switching between preamp tubes in the audio signal path. The input to the two or more tubes is switched between each tube by the listener on demand without pause or interruption to the music or program. The switching may be controlled manually, via remote, computer, tablet, or smart phone. The invention is capable of holding multiple preamp vacuum tubes in a ready powered state where one and only one tube is actively processing the audio signal, and the user can instantly switch the processing of the audio signal to any other tube without iinterruption, distortion, or overlap in the output signal.

Additionally, on a given channel, the signal path from the output of the plate of each preamp tube shares identical components up to and including the output jacks. The output channel for each tube is dependent on a shared output capacitor. This is an important because the objective is to compare two tubes not two amplifiers. In other words, if each tube had an independent output capacitor and other unique components in the output path the intention of a pure tube comparison would be lost. The user would be comparing parallel amplifiers housed in a single chassis not multiple tubes that sit in common sockets and share a common amplifier. The volume control is shared on the output side to ensure the comparison is limited to the tubes and does not include independent components like non-shared potentiometers in the signal path.

Switching is done on the input side of the device. By switching on the input side, the preamplifier retains the ability to share the output capacitor for each channel. The switch itself is a shared component in the signal path between the input and the output. The audio signal is routed to one of the active tubes via the switching mechanism where the contact relay itself is the only non-shared component in the signal path (aside from the tubes themselves) and which presents no detectible variance in the output.

In one embodiment, an audio device for amplifying an audio signal according to the principles of the invention comprises an input and an output having an audio signal path therebetween. A circuit is connected between the input and the output, and the circuit in part defines the audio signal path and includes a power supply. The circuit also includes a first active component connected to the power supply for maintaining the first active component in a powered state. The first active component is adapted to be selectively switched into the audio signal path to amplify the audio signal. The circuit also includes a second active component connected to the power supply for maintaining the second active component in a powered state. The second active component is adapted to be selectively switched into the audio signal path to amplify the audio signal. The circuit further a switch, such as a relay, for switching one powered active component into the audio signal path while the other active component is not switched into the audio signal path but remain in a powered state. This configuration allows a user of the audio device to readily switch between the first and second active components.

In some embodiments, the first and second active components are each removably mounted in a separate socket allowing the user, when the audio device is powered down, to replace either or both the first or second active components with different like active components.

In some embodiments, the first and second active components are vacuum tubes.

In some embodiments, the circuit includes one common output circuit, such as a common capacitor, coupled to outputs of the first and second active components.

In some embodiments, the switch is located between the input of the audio device and inputs of the first and second active components.

In some embodiments, the first and second active components are either MOSFET or BJT transistors.

In some embodiments, an input source may be coupled to the input of the audio device via standard wired connectors or coupled wirelessly for streaming input.

In some embodiments, the audio device is a preamplifier, a class A amplifier or a class A/B amplifier.

In some embodiments, the switch includes a remote control to allow the user to switch between the first and second active components, at a location spaced from the audio device.

In some embodiments, the audio device includes an indicator to identify which one of the first and second active components is switch into the audio signal path.

Various other aspects of this invention will become apparent to those skilled in the art from the following detailed description of the preferred embodiment, when read in light of the accompanying drawings.

DETAILED DESCRIPTION OF THE PREFERRED EMBODIMENTS

Figure 1:
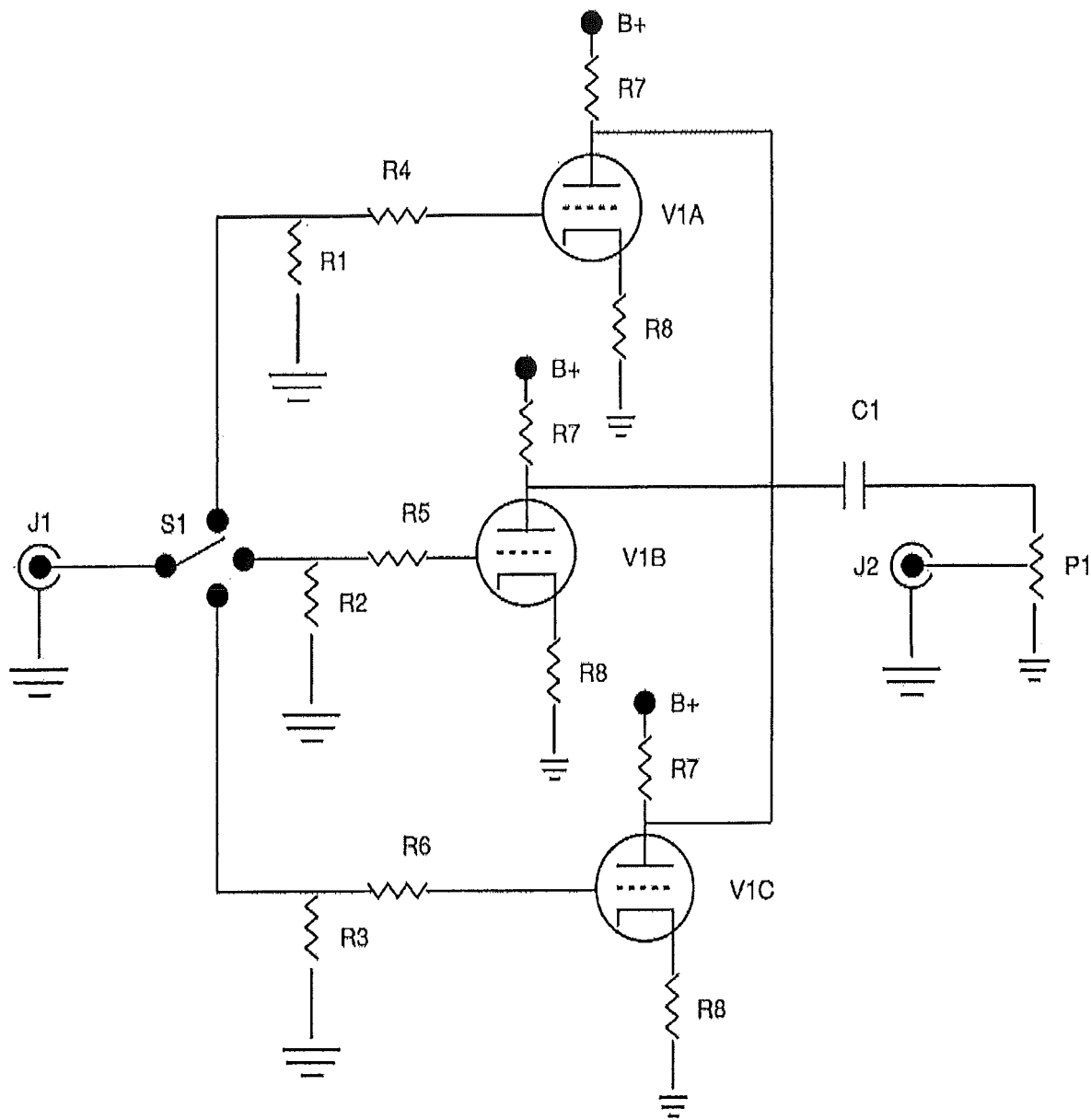
FIG. 1 represents a basic implementation of the invention, showing a tube preamplifier with a tube switching circuit for switching between three tubes.

Referring now to the drawings, FIG. 1 represents one channel of the base audio circuit for the invention. The drawing includes three preamp tubes V1A, V1B and V1C but the design is not limited to three preamp tubes, and can be two or more. The design of the power supply section (not shown) supplies the shared B+ voltage and current required to supply the audio circuit and may vary based on the number of tubes for a given implementation and or additional features such as remote control.

The line-in input at an input jack (J1) is switched by a switch S1 between a grid on tubes V1A through V1C. The drawing shows one channel but applies to both triode A and triode B of each half of the preamp tube. One half of the envelope is used for the left channel and the other half is used for the right channel.

The heater and plate voltages remain active for all tubes regardless of which tube is switched to receive the input signal. This ensures that each tube is warmed up and ready to provide an output signal at the flip of the switch S1 without interruption or degradation in the output.

All tubes in the base configuration leverage the same B+ to the plate of triode A and triode B of tubes V1A through V1C. It is important to note the base design's tubes share the same coupling output capacitor C1 between the plate of a given tube and a volume potentiometer P1.

While two tubes cannot physically inhabit the same socket this invention intends to create a "virtual" socket A, B and C (shown in FIG. 2) that holds any number of tubes with one and only one tube actively processing the signal at any given moment. In effect there will be no sonically discernible difference between manually swapping out tubes in socket A for comparison vs. manually swapping out the same tubes in socket B for comparison. So while sockets A and B are physically different they are virtually the same socket.

The preferred implementation is achieved by eliminating any components which may vary the output signal on a given channel. If the listener has two electrically identical matched tubes and detects some sonic difference the invention must not be the source of that sonic difference. So if the two tubes are tested and determined to be sonically different and the listener manually swaps tubes between their respective sockets, the sonic difference will follow the tube.

The standard features and functions associated with a high end tube preamplifier (and not shown in FIG. 1) would also apply to this invention. Multiple inputs for Phono, CD, Tape, Aux, and so on, as well as the potential for more than one output. In addition to switching described above, switching of source, destination, volume control, and other features such as variable gain may be controlled remotely or automatically based on preference.

As will be appreciated from the foregoing description, the audio device is designed to provide the means for critical comparison between vacuum tubes for various reasons. A few examples of intended uses are:

A/B/+n comparison between two or more unmatched tubes from different manufacturers or variants from the same manufacturer for example RCA short plate 12AU7 vs RCA long plate 12AU7.

A/B/+n comparison between two or more identical matched tubes from the same manufacturer to verify there is no audible difference.

Ability to hot switch between preamp tubes thought to be better suited to a particular input device, musical genre, or even a specific recording.

Isolate and identify a tube where two identical tubes test electronically identical but a listener suspects one varies sonically.

The preferred implementation also supports a wide range of popular tube variants. For example, the preamplifier of FIG. 1 may support 12AT7, 12AU7, 12AV7, 12AX7, 12AZ7 and any military or European equivalent tubes. Other variants of the design may include applications for other types of tubes in devices other than a preamplifier.

Figure 2:
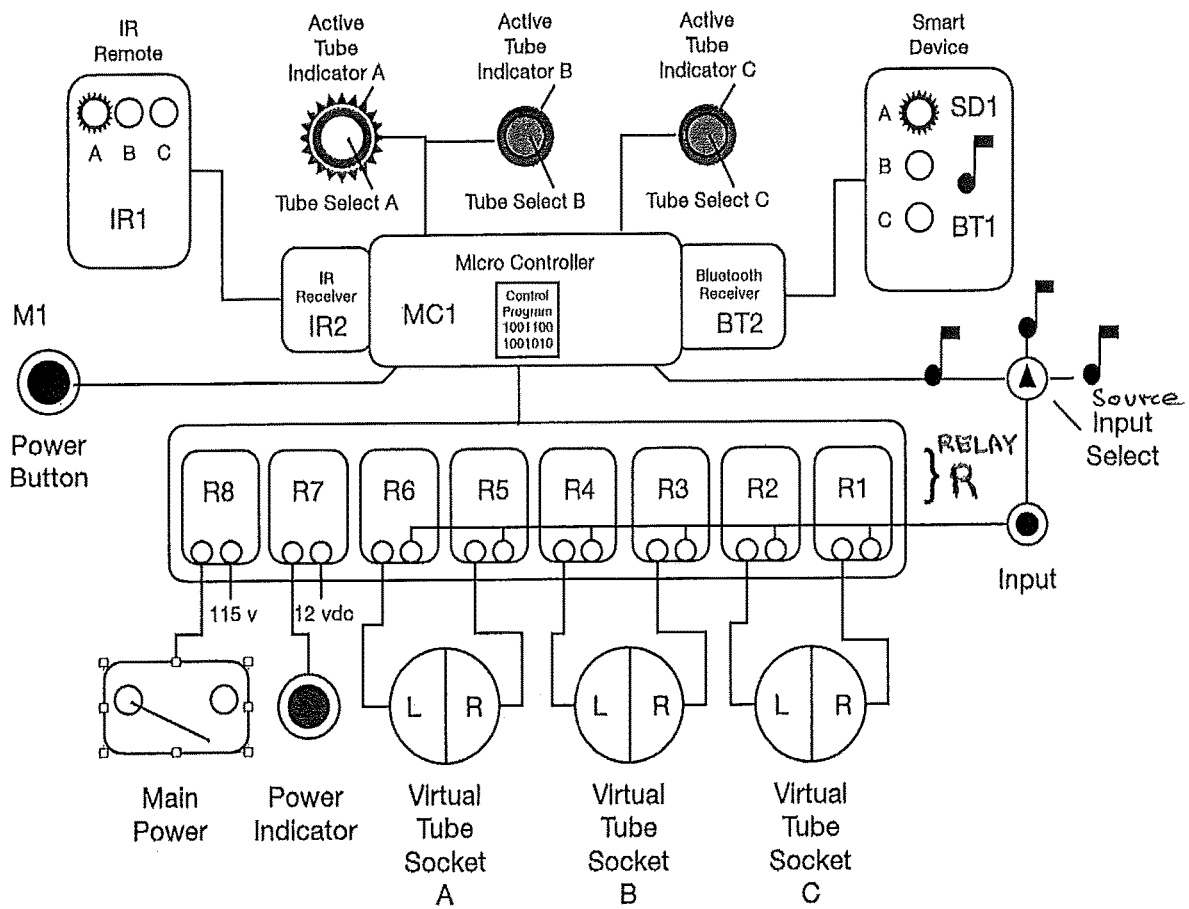
FIG. 2 illustrates one example of a control for the tube switching circuit of FIG. 1.

In some embodiments, a control such as shown in FIG. 2 may optionally be used to control the tube switching circuit of FIG. 1. The control of FIG. 2 provides switching via a smart-device (SD1), an infrared (IR) remote (IR1), or a physical button press on the device (Tube Select A, B, and C).

For smart device control, an app on the smart device (SDI) communicates wirelessly via its internal bluetooth module (BT1) to a bluetooth receiver (BT2) integrated into a micro-controller (MC1). Control commands are sent from the smart-device (SD1/BT1) to the micro-controller (MC1) via the bluetooth receiver (BT2). The micro-controller (MC1) in turn executes the command to control a multi channel relay module (R) that may be an eight channel optocoupler.

For IR remote control, the IR Remote (IR1) communicates with an IR receiver (IR2) integrated into the micro-controller (MC1). The micro-controller (MC1) in turn executes a command received from the IR Remote (IR1) to control the relay module (R). The micro controller (MC1) may be an ATmega328P microcontroller.

While the illustrated example incorporates IR or smart-phone for remote control, remote control may initiate control via other devices, for example: a tablet such as iPad, Android devices, laptops or desktops, infrared transmitters and receivers, wifi, web server on a chip or other technology. Additionally remote control may include power on/off, power indicator, volume control, gain control, source switching, output switching and other user interface features and functions.

The tube switching preamplifier includes momentary buttons on the device (Tube Select A, B, and C) which are illuminated thus acting as an Active Tube Indicator (Active Tube Indicator A, B, and C). The Active Tube Indicator identifies the active tube on the preamplifier corresponding to the active tube displayed in the remote app (SD1). The Active Tube Indicator visually indicates which tube is active and allows the user to remain in the optimal listening position when verifying the active tube.

The momentary buttons (Tube Select A, B, and C) on the device itself provide a secondary means to select the active tube. When the user presses the button on the device, audio processing switches to that tube and the button illuminates. This allows switching in the case the battery dies on the smart device (SD1) or the IR remote (IR1).

However, remote switching is preferred for the critical listening process which requires the listener to sit in a very specific location in the room to reproduce the stereophonic image with great fidelity. Getting up and walking over to the preamplifier to switch between preamp tubes impacts the immediacy of the comparison that can be obtained by remote switching.

In the embodiment of FIG. 2, there are three tubes which correspond to two relays each; one relay for left input and one for right input, totaling six relays R1 through R6, as noted above. The power and power indicator are controlled in a similar way leveraging relays R7 and R8 of the relay module (R); one relay R8 for power and one relay R7 for indicator.

The audio device may also include control software to facilitate remote control of the audio device control shown in FIG. 2. The control program controls the preamplifier's Virtual Tube Socket by defining the logic of the tube select commands from IR Remote, the Smart Device, the Tube Select switches, or other input command device. The program decodes bluetooth signals, IR signals, digital button signals, or pre-defined preferences which then drive the logic to activate the desired Virtual Tube Socket using relays R1 through R6 of the optocoupler relay R1.

When the device is powered on the controller software:
a. Initializes the objects and variables, then
b. Sets power indicator to active, then
c. Sets the active tube socket to the default Virtual Tube Socket, then
d. Illuminates the Active Tube Indicator, then
e. Waits for a control signal from the input command device.

The control signals in (e) above may be generated by:
pressing the Tube Select momentary buttons on the device;
pressing a dedicated remote button;
clicking a tube icon in the smart device app; or
from pre-defined user preferences.

The bluetooth receiver (BT2) in the preamplifier control of FIG. 2 supports the ability to stream music from a smart device to the preamplifier. Integration of music streaming within the control app includes the ability to send control signals based on song or playlist metadata.

The user is able to define preferences based on metadata such as Genre and Artist or based on specific playlists or song collections. The app then automatically activates the preferred Virtual Tube Socket when that genre, artist or playlist is streaming to the preamplifier.

The following paragraphs described selected examples of use of the invention.

Example 1. The listener has two preamp tubes, a first tube, e.g., a relatively inexpensive new production tube, and a second tube, e.g. a relatively expensive "new old stock" tube. This invention allows the listener to instantaneously switch between tubes with no pause in the output signal in order to evaluate the sonic qualities of the respective tubes side by side thus eliminating many variables that can color the comparison.

Example 2. The listener prefers to listen to British Invasion rock music using a Mullard 12AU7, but prefers Telefunken 12AU7 for classical music. The invention allows the listener to switch the amplifier section of the preamplifier between the respective tubes to suit his or her musical preference; at the push of a button, between recordings, and without the need to physically remove and replace vacuum tubes.

Example 3. Or the listener has a main amplifier which requires two driver tubes to drive the left and right channels. The tubes are the same manufacture same variant and while electronically matched the listener suspects one of the tubes has some internal defect which is causing distortion in that output channel. The invention allows the listener to remove said tubes from the main amplifier and install them in the invention to compare side by side; to ensure they sound identical in tone as well as gain, or determine if one or the other suffers from microphonic interference due to some internal defect.

Example 4. Most power amplifiers require more than one driver tube and it is essential the driver tubes are matched in order to create a convincing stereo image. The listener has a drawer full of compatible tubes that are each from different manufacturers but hesitates to use them together because they don't "match". The invention allows the user to find sonically matched tubes by A/B comparison ensuring that the gain and the balance are undistinguishable thereby expanding the library of tubes available in his or her collection for use in the main amplifier's driver section.

While the preferred embodiments are described in the context of a tube preamplifier, it will be readily appreciated that other audio amplifiers may benefit from the principles of the invention. In particular, the audio device can be a class A or class A/B amplifier, and the active amplifying components may be solid state components such as MOSFET or BJY transistors.

The principle and mode of operation of this invention have been explained and illustrated in its preferred embodiment. However, it must be understood that this invention may be practiced otherwise than as specifically explained and illustrated without departing from its spirit or scope.

What is claimed is:

1. An audio device for amplifying an audio signal comprising: an input and an output having an audio signal path therebetween; a circuit connected between the input and the output, the circuit in part defining the audio signal path and including a power supply; the circuit further including: a first active component including a first vacuum tube and connected to the power supply for maintaining the first active component in a powered state, the first active component adapted to be selectively switched into the audio signal path to amplify the audio signal; a second active component including a second vacuum tube and connected to the power supply for maintaining the second active component in a powered state, the second active component adapted to be selectively switched into the audio signal path to amplify the audio signal; a switch for switching either one of the powered first and second active component into the audio signal path while switching the other one of the first and second active component out of the audio signal path while the circuit maintains the other active component in a powered state, the switch being operable to enable only one of the firs and second active components to be in the audio signal path at a time, thereby allowing a user of the audio device to readily switch between the first and second active components.

2. The audio device according to claim 1 wherein the first and second active components are each removably mounted in a separate socket allowing the user, when the audio device is powered down, to replace either or both the first or second active components with different like active components.

3. The audio device according to claim 1 wherein the circuit includes one common output circuit coupled to outputs of the first and second active components.

4. The audio device according to claim 1 wherein the switch is located between the input of the audio device and inputs of the first and second active components.

5. The audio device according to claim 1 wherein an input source may be coupled to the input of the audio device via standard wired connectors or coupled wirelessly for streaming input.

6. The audio device according to claim 1 wherein the audio device is a preamplifier.

7. The audio device according to claim 1 wherein the audio device is a class A amplifier.

8. The audio device according to claim 1 wherein the audio device is class A/B amplifier.

9. The audio device according to claim 1 wherein the switch includes a remote control to allow the user to switch between the first and second active components, at a location spaced from the audio device.

10. The audio device according to claim 1 including an indicator to identify which one of the first and second active components is switch into the audio signal path.

* * * * *